(12) United States Patent
Ballandras et al.

(10) Patent No.: US 6,316,861 B1
(45) Date of Patent: Nov. 13, 2001

(54) LOW-LOSS SURFACE ACOUSTIC WAVE FILTER ON QUARTZ SUBSTRATE WITH OPTIMIZED CUT

(75) Inventors: Sylvain Ballandras, Avanne-Aveney; Marc Solal, Antibes; Emmanuelle Briot, Vallauris, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/420,942

(22) Filed: Oct. 19, 1999

(30) Foreign Application Priority Data

Oct. 30, 1998 (FR) .................................................. 98 13665

(51) Int. Cl.$^7$ ....................................................... H03H 9/25
(52) U.S. Cl. .................. 310/313 A; 310/360; 310/313 D
(58) Field of Search ........................... 310/313 A, 313 D, 310/360

(56) References Cited

U.S. PATENT DOCUMENTS

| | | | |
|---|---|---|---|
| 4,323,809 | * 4/1982 | O'Connell | 310/313 A |
| 4,398,115 | * 8/1983 | Gagnepain et al. | 310/313 A |
| 4,670,680 | * 6/1987 | Andle | 310/313 A |
| 4,701,661 | * 10/1987 | Warner et al. | 310/360 |
| 5,020,034 | * 5/1991 | Solal et al. | 367/138 |
| 5,475,348 | * 12/1995 | Hode et al. | 333/195 |
| 5,703,427 | * 12/1997 | Solal et al. | 310/313 D |
| 5,936,487 | * 8/1999 | Solal et al. | 333/193 |
| 5,953,433 | * 9/1999 | Fujimoto et al. | 381/337 |
| 6,031,315 | * 2/2000 | Abbott | 310/313 A |
| 6,088,462 | * 7/2000 | Fujimoto et al. | 381/160 |

FOREIGN PATENT DOCUMENTS 57-73513  * 5/1982  (JP) .................................. 310/313 A

OTHER PUBLICATIONS

S. Ballandras, et al., J. Acoust. Soc. Am., vol. 95, No. 3, pp. 1390–1395, "Doubly Rotated Saw Quartz Cuts With Low Sensitivity to Stress and Temperature Effects Exhibiting a Power Flow Angle Close to Zero", Mar., 1994.

S. Ballandras, et al., 8$^{th}$ European Frequency and Time Forum, 20 pages, "New–Doubly Rotated Quartz Cuts for the Design of Saw Resonators Low Sensitive to Thermal and Mechanical Perturbations", Mar., 1994.

S. Ballandras, et al., Proc. Of the 9$^{th}$ Piezoelectric Conference (Piezo 96), 6 pages, "Calculation of Saw Sensitivity to Mechanical Effects Using a Perturbation Method Coupled With Finite Element Analysis", Oct., 1996.

S. Ballandras, et al., IEEE Transactions on Ultrasonics, Ferroelectrics, and Frequency Control, vol. 45, No. 3, pp. 567–573, "Precise Modeling of Complex Saw Structures Using a Perturbation Method Hybridized With a Finite Element Analysis", May, 1998.

* cited by examiner

Primary Examiner—Thomas M. Dougherty
(74) Attorney, Agent, or Firm—Oblon, Spivak, McClelland, Maier & Neustadt, P.C.

(57) ABSTRACT

A low-loss surface acoustic wave filter on a quartz substrate with optimized cutting. A range of cutting angles and directions of propagation of the waves on the quartz substrate are defined, making it possible to obtain high coefficients of reflection of the electrodes used in the filter. The range of cutting angles and directions of propagation of the waves are decisive factors for the making of the filter.

12 Claims, 12 Drawing Sheets

LOW-LOSS SURFACE ACOUSTIC WAVE FILTER ON QUARTZ SUBSTRATE WITH OPTIMIZED CUT

BACKGROUND OF THE INVENTION

1. Field of the Invention

The field of the invention is that of acoustic wave devices and specially that of filters or resonators made on the surface of a substrate made of piezoelectric material.

The material used for making a surface acoustic wave device and the cut of the material are generally chosen on the basis of two criteria: the piezoelectric coupling coefficient that characterizes the maximum relative band that can be obtained and the behavior of the material as a function of the temperature. Indeed, when the temperature rises, the material expands and its coefficients of elasticity vary, giving rise to variations in the speed of propagation of the surface wave and hence in the frequency of the devices.

2. Description of the Prior Art

Quartz is a material that has long been used for surface acoustic wave filters. The cut generally used is what is called the ST cut (M B. Schultz, B. J. Matzinger, M. G. Holland, "Temperature Dependence of Surface Acoustic Wave Velocity on α Quartz", Journal of Applied Physics, Vol. 41, No. 7, pp. 2755–2765, (1970)). The cutting angles $\phi$, $\theta$ and $\psi$ are defined by the IEEE standard (Standard on Piezoelectricity Std 176-1949, Proc. IRE, Vol. 37, pp. 1378–1395 (1949)).

To avoid ambiguity in the definition of the cutting angles, we shall recall the definition of these angles here below. The axes X, Y and Z are the crystallographic axes of the crystal. The crystal chosen is known as a "left-hand quartz" crystal and is characterized by the sign of the piezoelectric constants $e_{11}$ and $e_{14}$. "Left-hand quartz" is quartz such that $e_{11}$ is positive and $e_{14}$ is negative. FIG. 1 shows a plate with a cut (XY). This means that the normal to the cutting plane is the axis Y and the direction of propagation is the axis X. This figure defines the direction W (along the width of the plate), I (along its length which is therefore the direction of propagation) and t (perpendicular to the plate). A cut and an angle of propagation are defined starting from the cut (YX) and by applying three successive rotations. The rotation about W is a rotation by an angle $\phi$, the rotation about I by an angle $\theta$ and the rotation about t by an angle $\psi$. The propagation takes place along the direction I of the rotated plate. The cutting plane is therefore defined entirely by the two angles $\phi$ and $\theta$ (FIG. 2a) while the third angle $\psi$ defines a particular direction in this plane and therefore, for the surface waves, the direction of propagation used (FIG. 2b).

Here below, we shall recall the angles defining different cuts commonly used for volume wave filters:

BT cut: $\phi=0$, $\theta=-49°$
AT cut: $\phi=0$, $\theta=+35°$
SC cut: $\phi=-22.4°$, $\theta=+33.8°$ The ST cut commonly used for surface wave devices is defined by the angles $\phi=0°$, $\theta=42.75°$ and $\psi=0°$. This cut is described in FIG. 3. The initial axial reference system is (XYZ). After the first rotation it becomes (X'Y'Z'), after the second rotation (X"Y"Z"), and after the third rotation (X'''Y'''Z''').

This single-rotation cut has the advantage, for the Rayleigh waves, of showing a variation of the frequency with the temperature that is parabolic with a reversal point at about 25 degrees Celsius (25° C.), i.e. often in the middle of the range of temperature of operation for the filters. The coupling coefficient for this cut is relatively low (about 0.12%).

If we deposit a material such as aluminum for example, especially to make a transducer that generates surface acoustic waves on the surface of the substrate, the reversal temperature point changes. Indeed, to compensate for this effect and keep a reversal temperature point close to 25° C., the cut is slightly changed. This leads to the use of cuts starting from $\theta=30°$ up to $\theta=42°$. These cuts all have characteristics very close to each other, apart from the speed of propagation of the waves and the reversal point of their frequency-temperature relationship.

In the past few years, increasing numbers of filters have been made with low insertion losses. To reduce insertion losses, the reflection of surface waves on electrodes is often used. Most frequently, the material used for the electrodes is aluminum. The filters that use these reflections are, for example, resonator filters or one-directional filters of the DART or SPUDT type. The coefficient of reflection on an electrode is a very important characteristic for the designing of these devices. Indeed, the greater the coefficient, the easier will it be to achieve low losses with a small chip size. Furthermore, there are also surface acoustic wave resonators being made that use other types of reflectors such as etched gratings or, more often, gratings of metallized lines to form cavities. For this type of device also, the reflection coefficient is an important characteristic as a high reflection coefficient makes it possible to have a cavity with lower losses for the same size and therefore improves the Quality factor of the resonator.

It must be noted however that, when a device is being designed, the reflection coefficient is limited by the maximum thickness of the electrodes that can be made. Furthermore, the sensitivity to the technological uncertainties of manufacture (in terms of the thickness of the metallization or the line width) is all the greater as the thickness of the metallization is great. This limits the thickness that can be used in practice.

SUMMARY OF THE INVENTION

In this context, an object of the invention is a surface acoustic wave device that uses a quartz substrate and reflection centers for which the coefficient of reflection used is improved while preserving the other properties of the material through an optimized choice of the cut of the quartz used as a piezoelectric substrate.

More specifically, an object of the invention is a surface acoustic wave device comprising:

a quartz substrate having a surface of propagation of surface acoustic waves;

means to create transduction centers and reflection centers on said substrate;

the substrate having a cutting plane (X", Z") defined with respect to the cutting plane (X, Z) and in a reference system (X", Y", Z"), if X, Y, Z are the crystallographic axes of quartz, the direction of propagation of the waves being defined along an axis X''', a first cutting plane (X', Z') being defined by rotation by an angle $\phi$ about the axis Z of the plane (X, Z) so as to define a first reference system (X', Y', Z') with an axis Z' that is the same as the axis Z, a second cutting plane (X", Z") being defined by rotation by an angle $\theta$ about the axis X' of the plane (X', Z') so as to define a second reference system (X", Y", Z") with the axis X" being the same as the axis X', the direction of propagation along the axis X''' being defined by rotation by an angle $\psi$ of the axis X", in the plane (X", Z") about the axis Y", wherein:

$60° \leq \phi \leq 0°$ $\theta$ is contained in a range of $\pm 40°$ around $-40°.\cos(3\phi)$ ψ is contained in a range of ±22.5° around 35°+10°.sine (3φ)

According to a first alternative embodiment, all the transduction centers and all the centers of reflection may belong to one and the same set of interdigitated electrodes.

According to a second alternative embodiment of the invention, certain centers of reflection may belong to a separate array of electrodes.

According to a third alternative embodiment of the invention, the device may also include centers of reflection coming from a grating etched in the quartz substrate.

Advantageously, the metallizations used in a device according to the invention are made of aluminum.

According to one alternative embodiment of the invention, the surface acoustic wave device may be a one-directional filter of the SPUDT or RSPUDT type.

The ST-cut of quartz presently used gives satisfactory performance characteristics in terms of coupling coefficient and curve of frequency/temperature variation. However the introduction and increasingly widespread use of reflective elements in the new types of filters is giving rise to an additional constraint that makes the ST-cut relatively less worthwhile when the greatest importance is placed on the reflection coefficient of a reflector, especially when it is made of aluminum.

The physical parameters described here below in the following description will show that there is a range of quartz cuts having equivalent properties in terms of temperature drift and coupling coefficient but having higher reflection coefficients for the reflective elements. The use of one of these cuts therefore makes it possible to obtain a surface acoustic wave device that uses reflectors and has advantages as compared with the equivalent device with an ST-cut.

Furthermore, it may be particularly advantageous to define a subset of quartz cuts for which the temperature coefficient of the first-order frequency is low, typically ranging from −10 ppm/° K to +10 ppm° K, and for which the angle of the flux is also low, typically ranging from −5° to +5°. The first condition leads to obtaining a reversal temperature of the frequency-temperature relationship close to 25° C., which is what is sought in practice.

The second condition makes it possible to optimize the operation of the surface acoustic wave devices in the smallest possible size (with no shift of transducers to compensate for said angle of energy flux).

Indeed, for surface acoustic wave devices:

$$\Delta f/fo = CTF_1(T-To) + CTF_2(T-To)^2$$

if $CTF_1$: first-order coefficient $CTF_2$: second-order coefficient.

To is the computation temperature of the first-order and second-order coefficients (generally 25° C.).

Δf corresponds to the frequency variation induced for a current temperature of 298° K; the reversal temperature is obtained by resolving the equation d (Δf/fo)/dT=0 which corresponds to a temperature of reversal $$T = To - \frac{CTF1}{2CTF_2}$$

with $CTF_2$ close to −50 ppb/° $K^2$, for example
and $CTF_1$ close to −1 ppm/° K, for example
the following temperature of reversal is obtained T=To−10° K

BRIEF DESCRIPTION OF THE DRAWINGS

The invention will be understood more clearly and other advantages shall appear from the following description given by way of a non-restrictive embodiment with reference to the appended figures, of which.

MORE DETAILED DESCRIPTION

Figure 1:
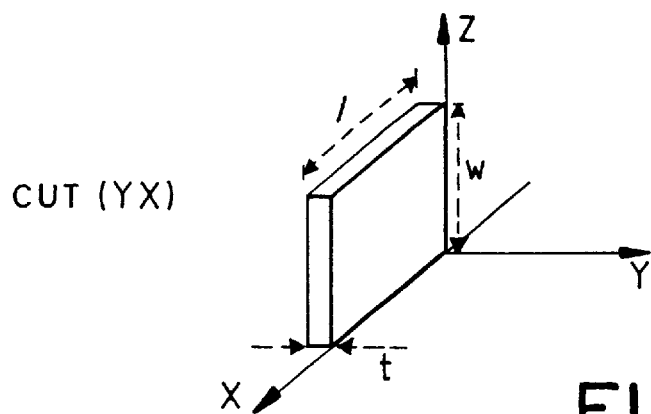
FIG. 1 shows a quartz plate with a YX-cut.
Figure 2A:
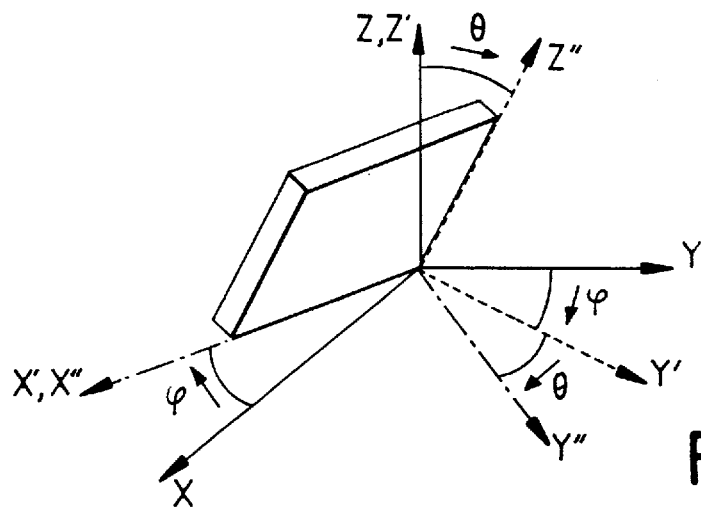
FIGS. 2a and 2b illustrate the definition of a cut and an angle of propagation with reference to the YX-cut.
Figure 2B:
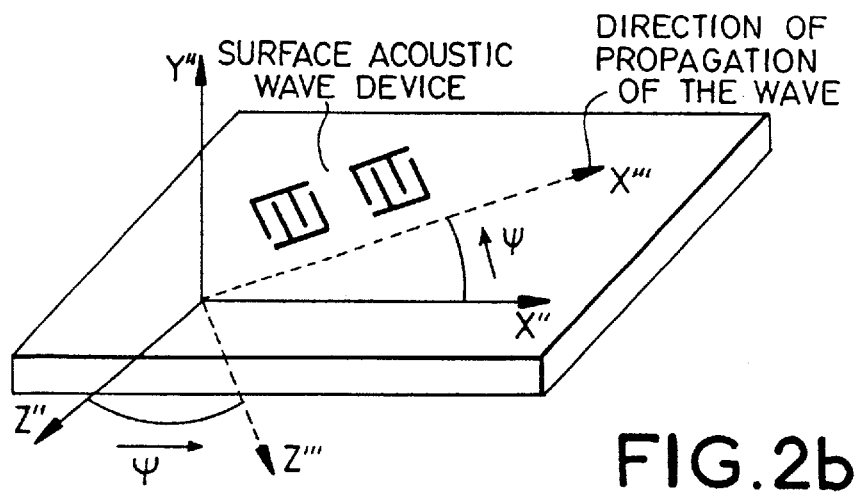
Figure 3:
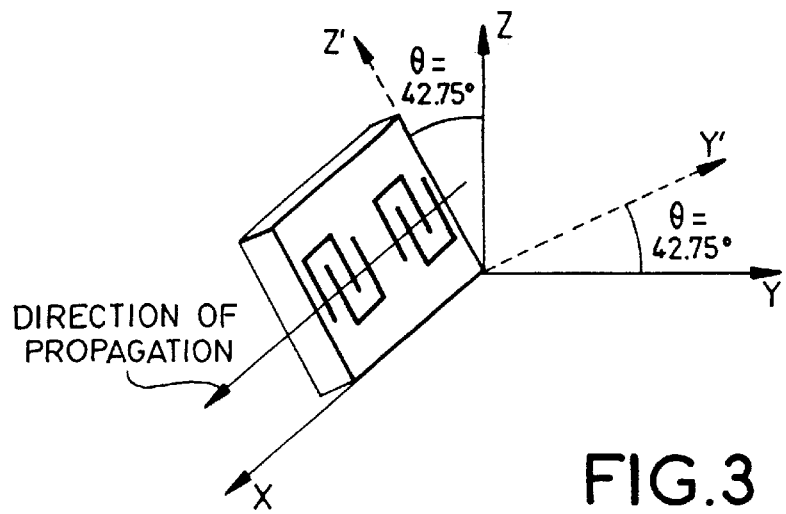
FIG. 3 illustrates a ST-cut quartz used in prior art devices.
Figure 4:
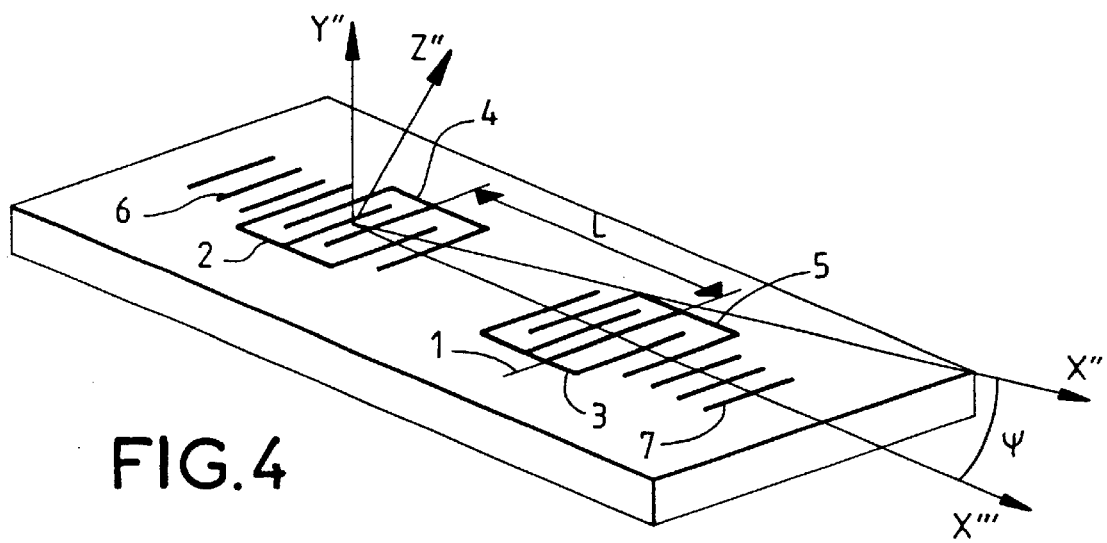
FIG. 4 is a view in perspective of a surface acoustic wave device illustrating interdigitated transducers as well as arrays of electrodes on a quartz substrate with a cut according to the invention.

FIG. 4 gives a very schematic view of an exemplary surface acoustic wave device according to the invention. The device comprises transduction centers and reflection centers made by means of metallic electrodes. More specifically, this device has two interdigitated electrode transducers 2, 3, 4 and 5 and two reflectors 6 and 7 formed by gratings of lines. The direction of propagation is the direction X''' of the substrate after rotation and is therefore the axis X'' of the cutting plane defined by the angles φ and θ rotated by an angle ψ.

For each cutting plane defining a given quartz substrate, there is a preferred direction of propagation of the surface acoustic waves for which the performance characteristics of the device are optimized.

This direction of propagation is defined by the angle Ψ:

According to the invention Ψ=35°+10° (sin (3φ)).

Here below, for different directions of cutting planes and directions of propagation of the acoustic waves, we shall give the values of:

the coupling coefficient $K_s^2$ representing the maximum relative band that can be obtained with a device and computed as the relative semi-difference between the speeds of the surface waves on the free substrate and the metallized substrate;

the reflection coefficient R of the reflector computed in terms of h/λ, if h is the thickness of metal and λ is the wavelength;

the angle of energy flux η (in degrees) which is the angle between the wave vector and the Poynting vector of the surface wave;

the first-order coefficient of the variation in the characteristic frequency of the filter as a function of the temperature, in the vicinity of the ambient temperature (25° C.);

the speed of propagation of the surface waves V∞;

the second-order coefficient of the variation in the characteristic frequency of the filter as a function of the temperature, in the vicinity of the ambient temperature (25° C.);

the temperature of reversal of the temperature/frequency curve that is the peak of the frequency/temperature curve for zero thickness. To minimize the variations in frequency of a surface wave device, it is necessary to choose a cut such that this temperature of reversal is near the middle of the range of operating temperature It must be noted that, for thin electrodes, the mechanical part of R may be deemed to be proportional to the thickness of the electrode h standardized at the wavelength. A simplified model based on the computations of Datta and Hunsinger (S. Datta, B. Hunsinger, "First-Order Reflection Coefficient of Surface Acoustic Waves From Thin Strip Overlays", Journal of Applied Physics, Vol. 50, No. 9, pp. 5661–5665 (1979)), may enable the reflection coefficient to be estimated with high precision. For ST-cuts of the quartz and for electrodes with a width of $\lambda/4$, R is in the range of 0.5 $h/\lambda$. For electrodes of greater thicknesses, an effect called an "energy storage" effect occurs, and the computation of Datta and Hunsinger is no longer as reliable (P. Ventura, J. Desbois, L. Boyer, "A Mixed FEM/Analytical Model of Electrode Mechanical Perturbation For SAW And PSAW Propagation", Proc. of the 1993 IEEE Ultrasonics Symposium, IEEE cat. No. 93 CH 3301-9, pp. 205–208).

However, our calculations have shows that it may be assumed that this computation enables the cuts to be classified properly with regard to their mechanical reflection coefficient. Furthermore, since the mechanical properties of quartz and aluminum are similar to each other, it may be deemed that the cuts chosen for high reflection coefficient on an aluminum band will also have a high reflection coefficient on a groove etched in the quartz.

The results of the computations (see Table II) show that for the cut zones defined in the invention, the coupling coefficient is always at least in the same range as the coupling coefficient on the ST-cut of quartz. Furthermore, for all the cuts of the zone, there are one or more angles of propagation ψ for which the temperature of reversal is about 25° C.

Table I recapitulates and provides references for the different cutting planes identified by the angles φ and θ associated with a direction of propagation identified by the angle ψ. The angle ψ and the cut θ are chosen for the coincidence of high reflection coefficients, an angle of energy flux close to 0° and their temperature of reversal which is close to 25° C.

Table II recapitulates the physical parameters mentioned here above corresponding to the cuts of Table I.

TABLE I

| φ(degrees) | θ(degrees) | ψ(degrees) | Reference |
|---|---|---|---|
| −60 | +45.5 | +23 | (a) |
| −50 | +39 | +20 | (b) |
| −40 | +35.5 | +18 | (c) |
| −30 | +37 | +15 | (d) |
| −30 | −38 | +18 | (e) |
| −20 | −35.5 | +20 | (f) |
| −10 | −38.5 | +22 | (g) |
| 0 | −45 | +24.75 | (h) |

TABLE II

| CUT | (a) | (b) | (c) | (d) | (e) | (f) | (g) | (h) | ST |
|---|---|---|---|---|---|---|---|---|---|
| $K_s^2$ (%) | 1.47 | 1.57 | 1.46 | 1.33 | 1.24 | 1.37 | 1.51 | 1.3 | 1.16 |
| R∞ (h/λ) | 2.16 | 2.05 | 1.7 | 1.22 | 1.2 | 1.7 | 2.1 | 2.15 | 0.51 |
| angle of energy flux | −0.53 | 0.17 | 0.11 | 0.4 | 0.15 | 0.1 | 0.1 | 0.6 | 0 |
| η (degrees) first-order coefficient of variation in the frequency (ppm/°K.) at $\Delta f$ 25 deg C. $\Delta T$ | 0.33 | 1 | −0.02 | −0.7 | −0.5 | −0.04 | 0.31 | 0.61 | −0.06 |
| V∞ (m.s$^{-1}$) | 3626 | 3548 | 3444 | 3324 | 3320 | 3444 | 3546 | 3625 | 3157 |
| second-order variation in the frequency ($10^{-9}$/° K.2) at $\Delta^2 f$ 25 deg C. $\Delta T^2$ | −49.7 | −47 | −45.6 | −40.7 | −43.2 | −44.1 | −47.8 | −50.4 | −40.1 |
| temperature in turn over $\theta_{turn}$ (° C.) | 28.3 | 35.6 | 24.8 | 18.6 | 16.7 | 17.4 | 28 | 30.6 | 17.3 |

It can be seen from Table II that the cutting planes associated with preferred directions of propagation of the acoustic waves recommended in the present invention enable an increase in the reflection coefficient R while at the same time preserving the other characteristic parameters.

It may furthermore be recalled that there are symmetries for Rayleigh waves on quartz such that:

$(+\phi, \theta, +\psi)$ is equivalent to $(-\phi, \theta, -\psi)$ whatever the sign of $\theta$ $(\phi, \theta, \psi)$ is equivalent to $(\phi+120°, \theta, \psi)$ $(\phi, \theta, \psi)$ is equivalent to $(\phi, \theta+180°, \psi)$ $(\phi, \theta, \psi)$ is equivalent to $(\phi, \theta, \psi+180°)$ except for the reflection coefficient whose phase will be reversed.

In combining these different symmetries, it is assumed that the properties of the Rayleigh waves are described solely for quartz in the following ranges of angles:

$$-60° < \phi < +60°, -90° < \theta < +90°, 0° < \psi < +90°$$

Figure 5:
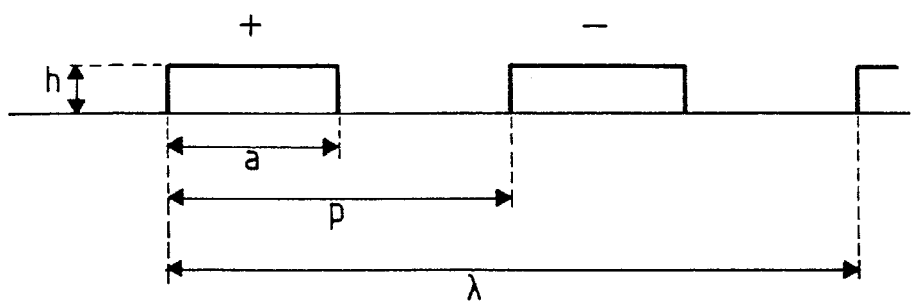
FIG. 5 illustrates the geometry of electrodes used in a surface acoustic wave device.
Figure 6A:
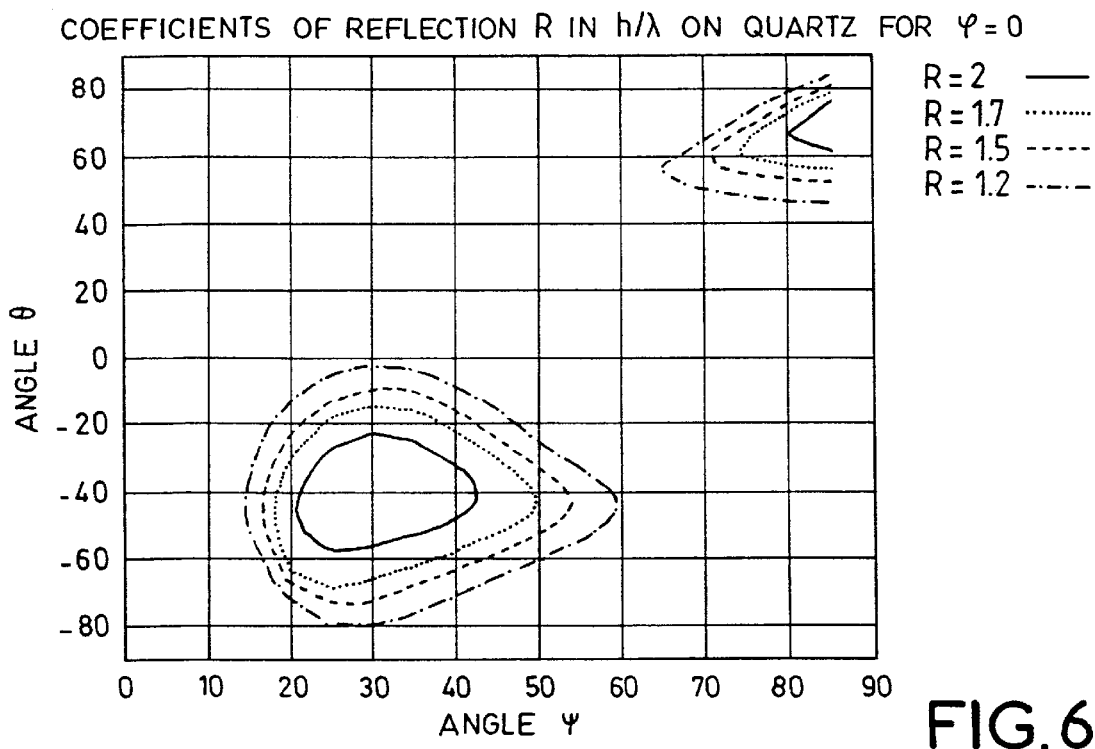
FIGS. 6a to 6g illustrate curves of isovalues of reflection coefficient as a function of the cutting angle θ and the angle of propagation ψ respectively for angles φ=0, −10, −20, −30, −40, −50, −60.
Figure 6B:
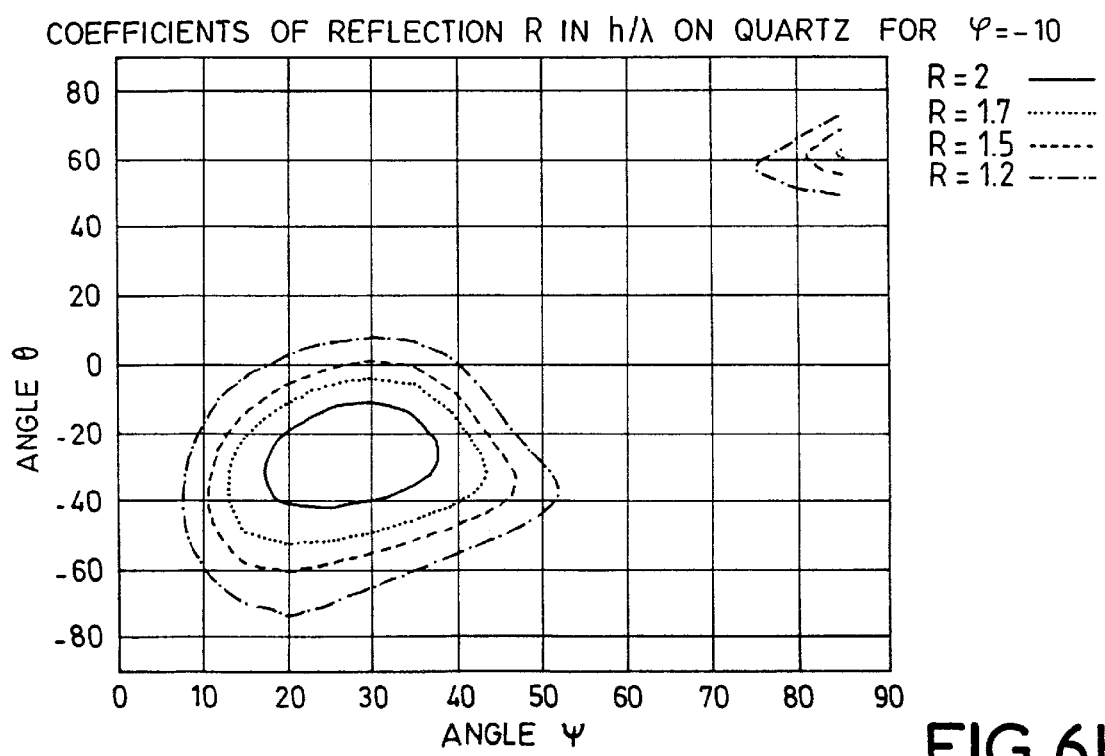
Figure 6C:
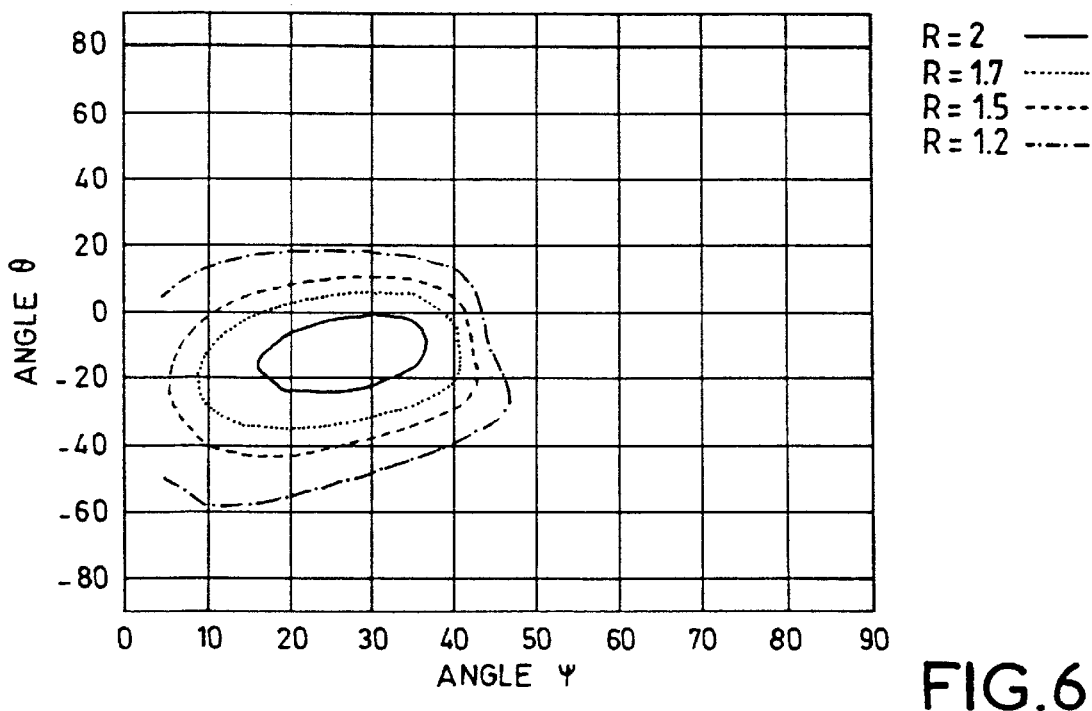
Figure 6D:
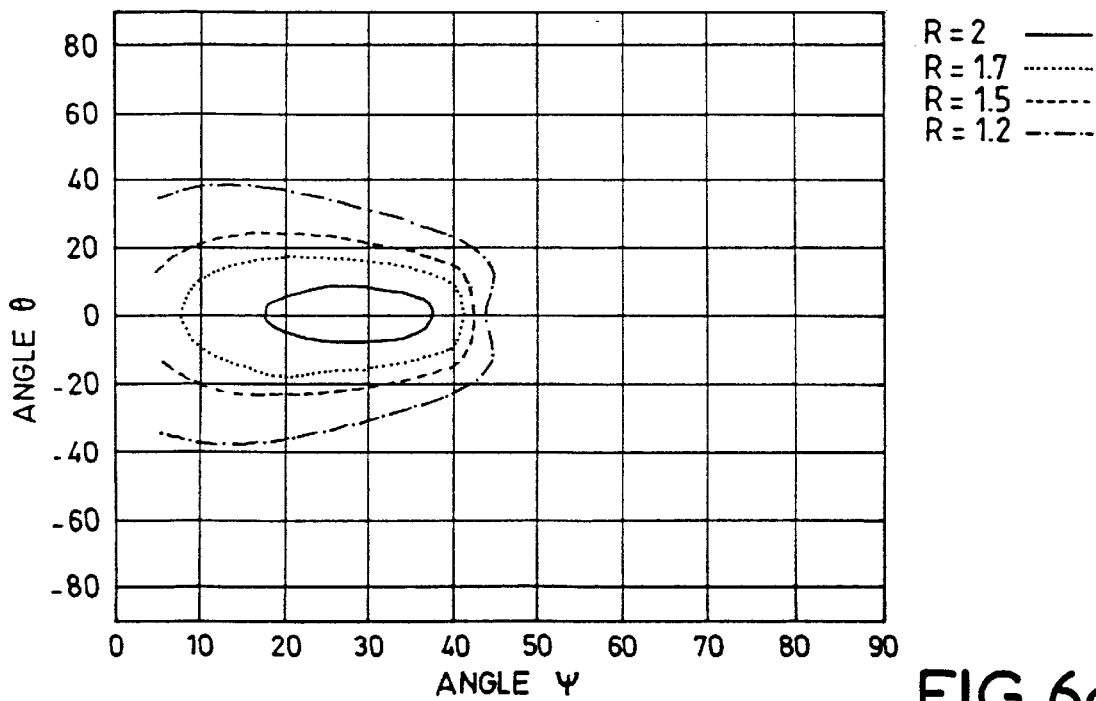
Figure 6E:
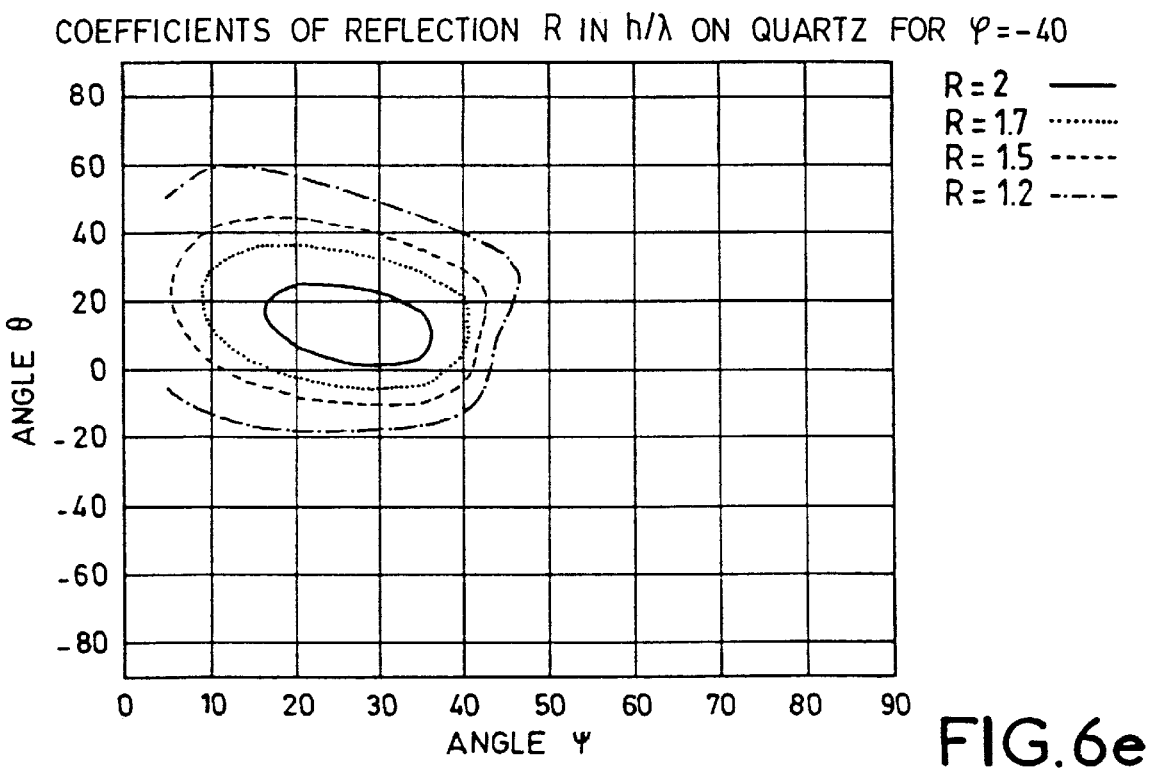
Figure 6F:
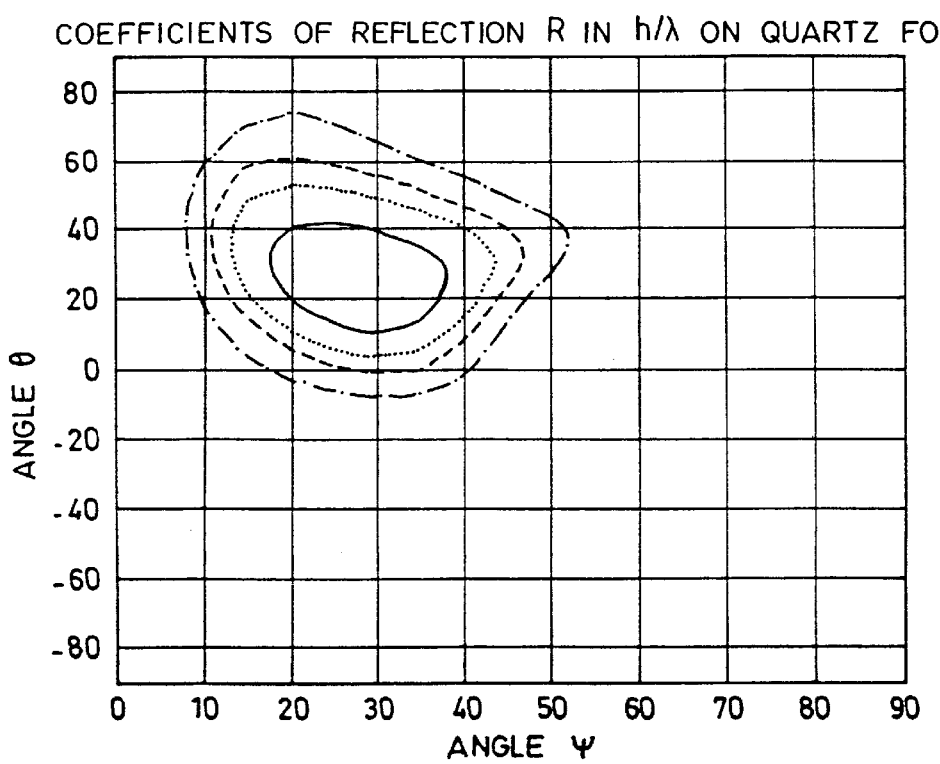
Figure 6G:
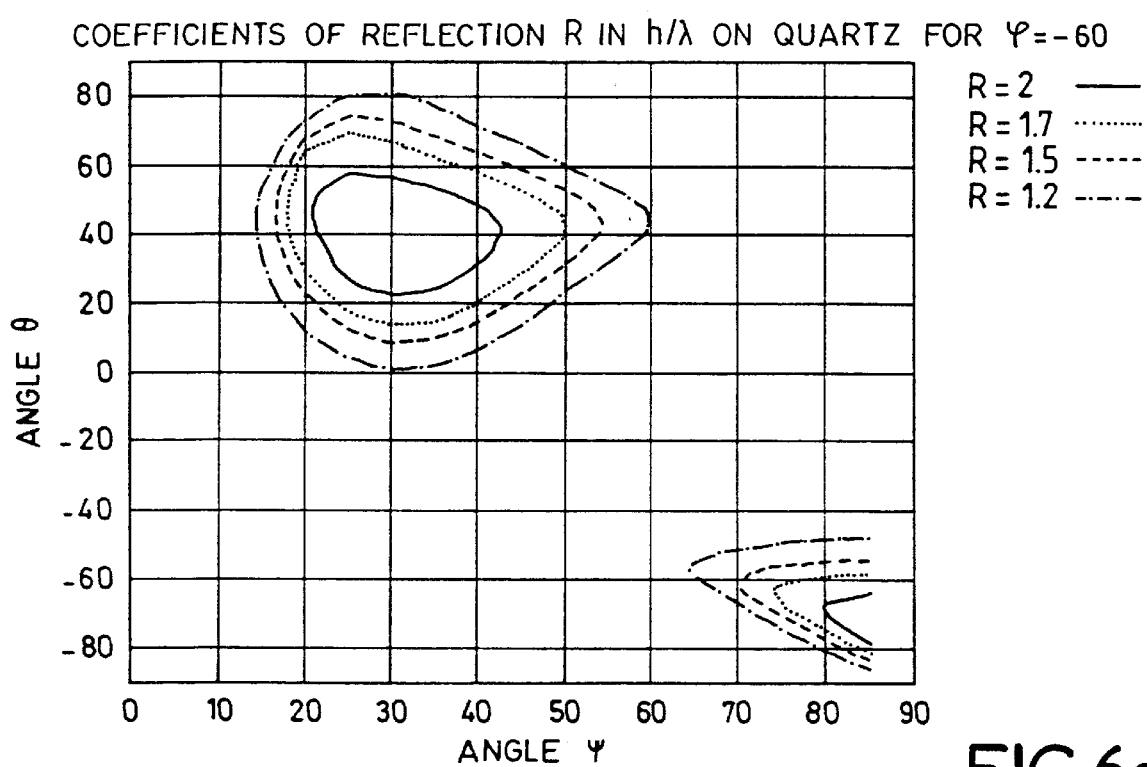
Figure 7A:
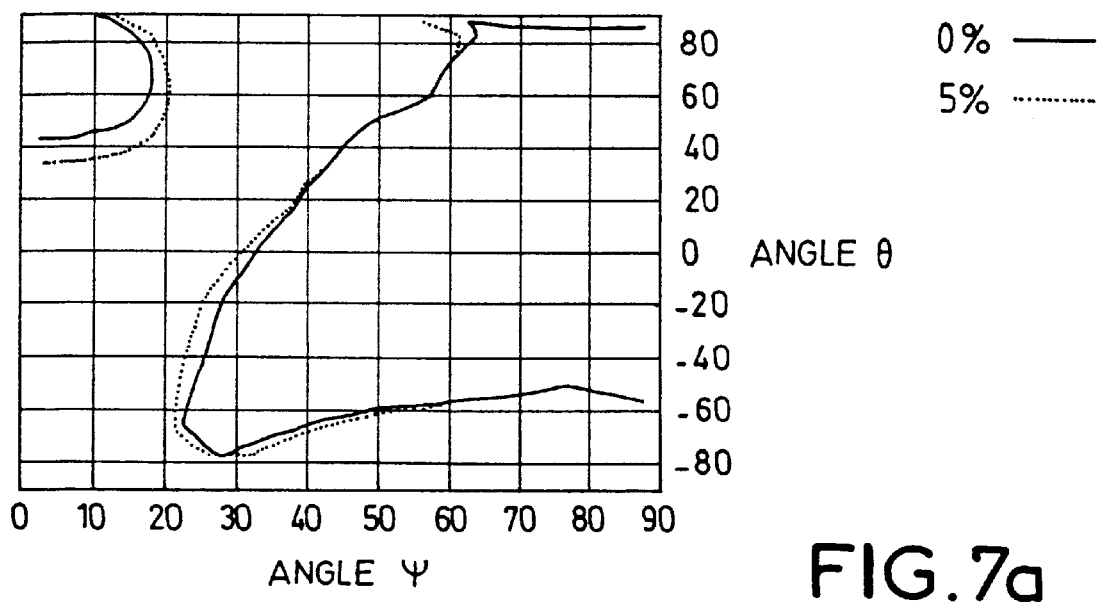
FIGS. 7a to 7g illustrate curves of isovalues of the temperatures of reversal equal to 25° C., as a function of the angles θ and ψ respectively for the angles up φ=0, −10, −20, −30, −40, −50, −60.
Figure 7B:
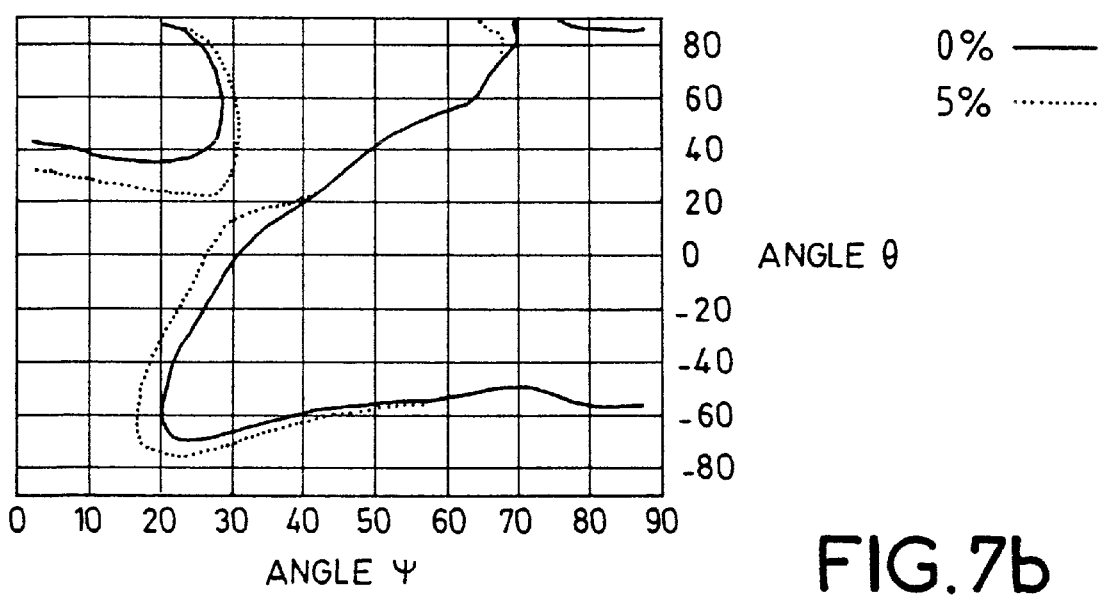
Figure 7C:
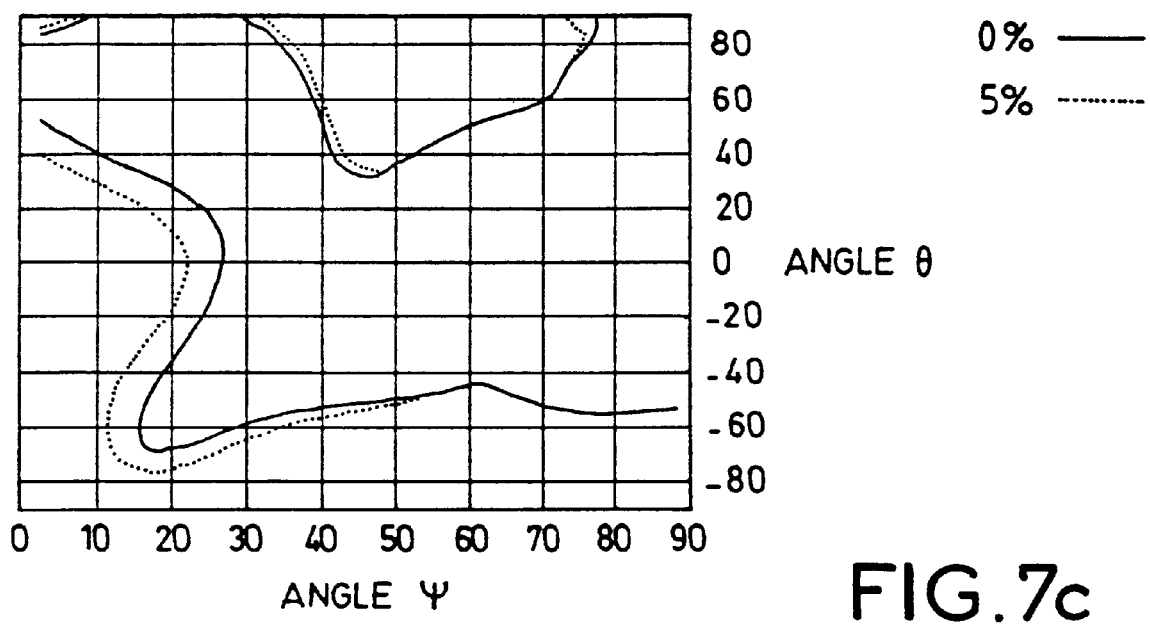
Figure 7D:
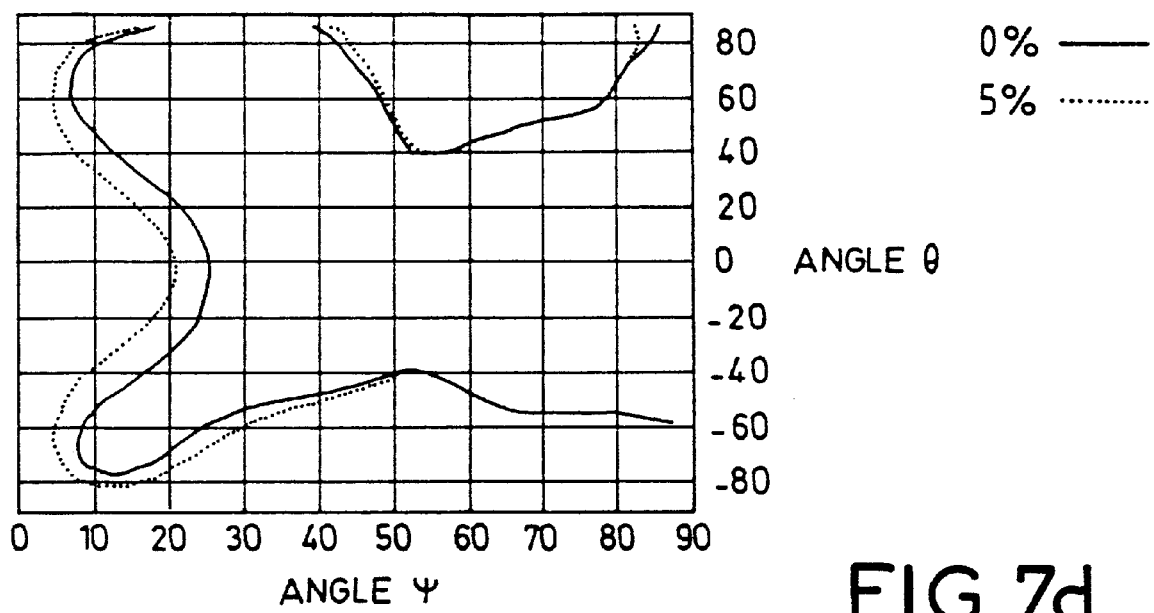
Figure 7E:
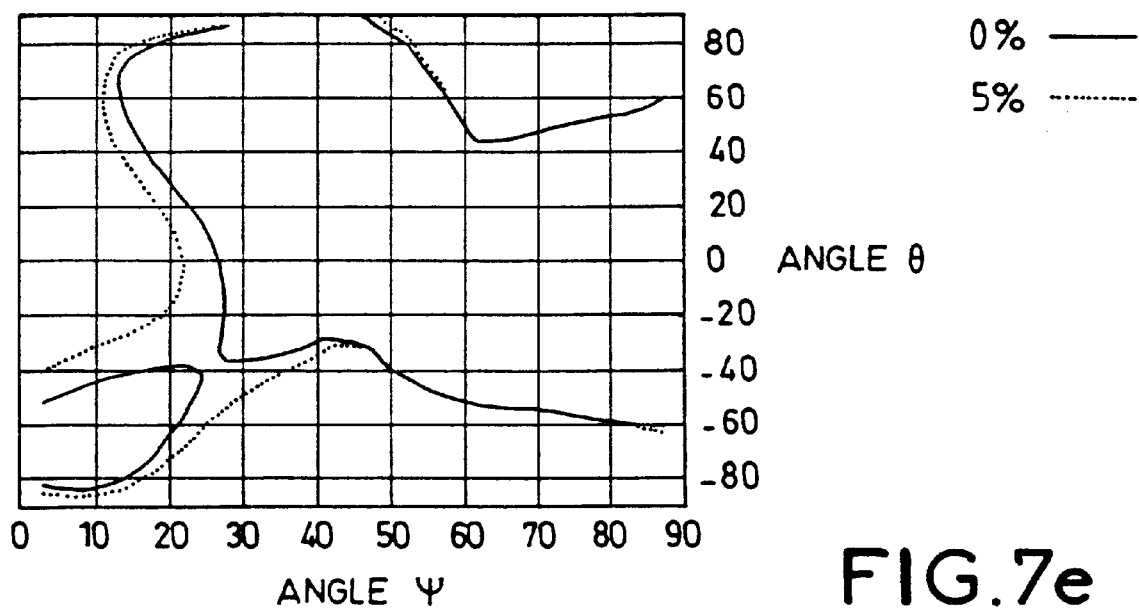
Figure 7F:
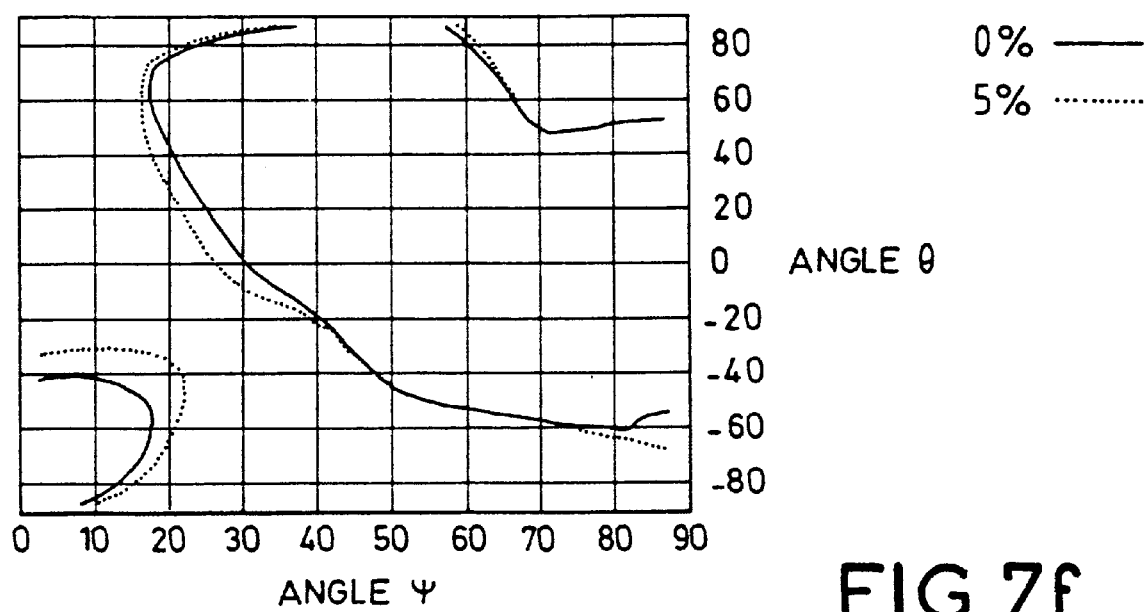
Figure 7G:
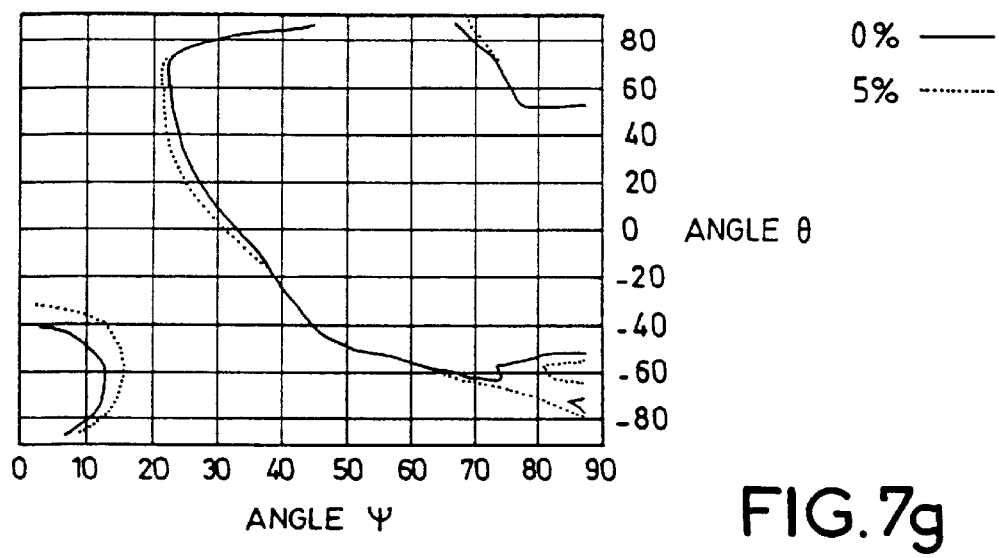

FIGS. 6a to 6g illustrate the curves of isovalues of coefficients of reflection on an aluminium obstacle with a small relative thickness h/λ. These curves have been plotted in taking the ratio between the height h and the acoustic wavelength λ to be far smaller than 1% for a metallization per period ratio a/p of 50% as shown in FIG. 5. This has been computed by means of the simplified model based on the computations of Datta and Hunsinger as a function of the section angle θ and the direction of propagation ψ for the different values of the section angle φ concerned by the claims (namely from 0° to -60° per step of 10°). These curves make it possible to graphically specify the zones with high reflection coefficient R that are the object of the invention. However, in order to somewhat reduce the ranges of angles concerned, FIGS. 7a to 7g show the isovalues of temperature of reversal equal to 25° C. for relative thicknesses of metallization h/λ that are zero and equal to 5% with a/p=50% for the same values of angle. This latter piece of information relating to the influence of the thickness of metallization can however be used only informally for it is derived from a theoretical computation validated solely for the ST-cut (E. Henry, S. Ballandras, E. Bigler, G. Marianneau, G. Martin, S. Camou, "Influence of Metallization on Temperature Sensitivity of SAW Devices" Proc. of the IEEE Ultrasonics Symp., pp. 221–226, 1997). The cut (f) must therefore to be taken with the customary precautions.

Exemplary Filter Made on a Quartz Plate Cut According to the Invention

Figure 8:
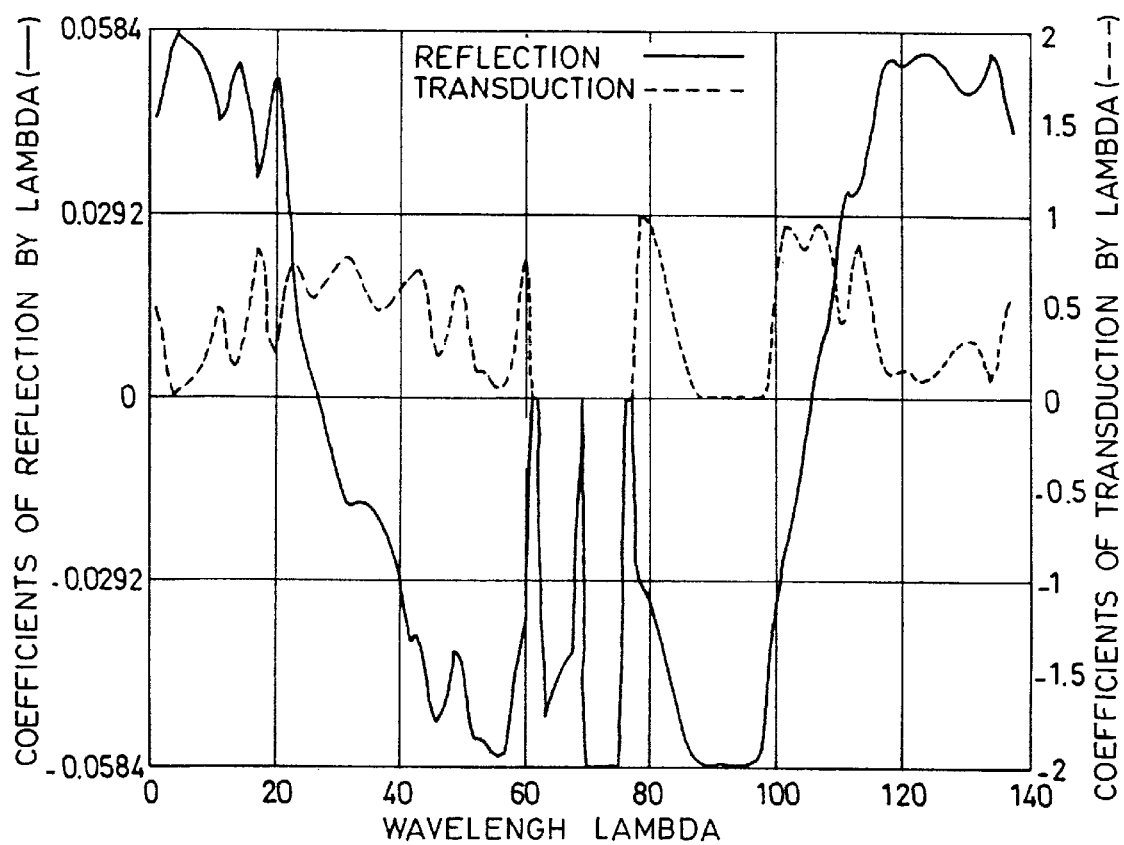
FIG. 8 illustrates the spatial distribution of the reflectors and of the transducers used in a filter made on the surface of a quartz substrate with a cut defined by the angles φ=−20°, θ=−35.5° and ψ=+20°.
Figure 9:
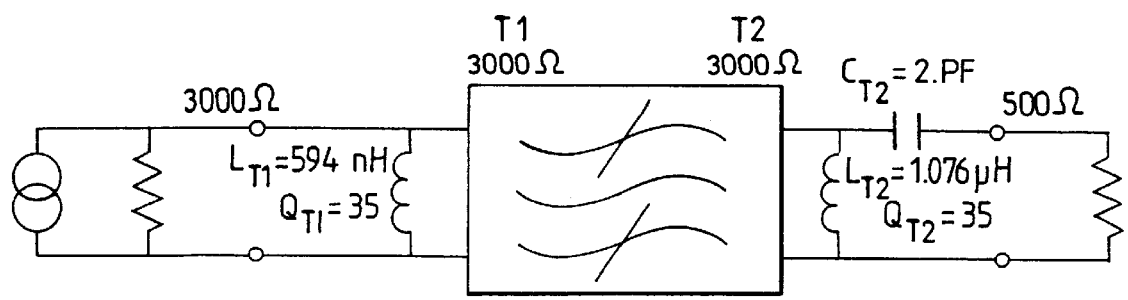
FIG. 9 provides a schematic view of the electrical elements enabling the matching of the filter made on the cut defined by the angles φ=−20°, θ=−35.5° and ψ=+20°.
Figure 10:
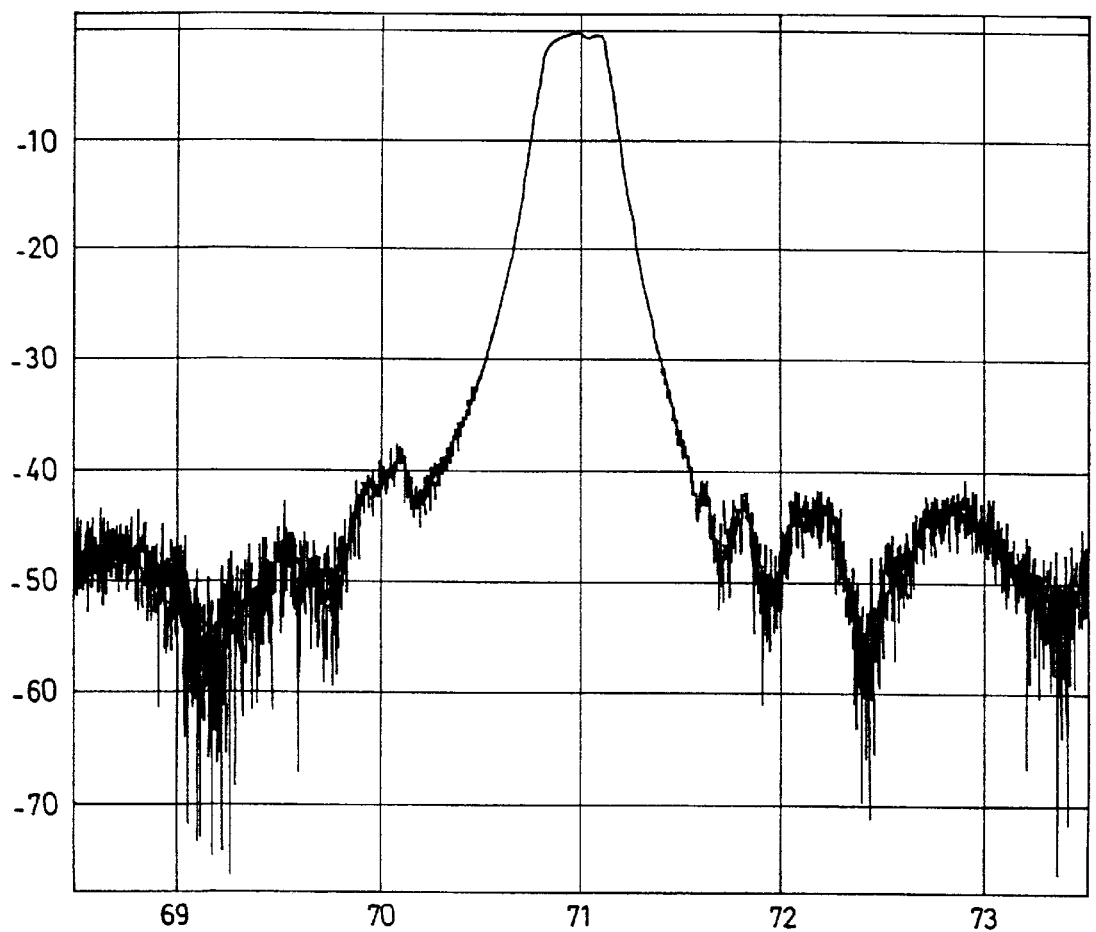
FIG. 10 illustrates the frequency response of the filter made on the cut defined by the angles φ=−20°, θ=−35.5° and ψ=+20°.
Figure 11:
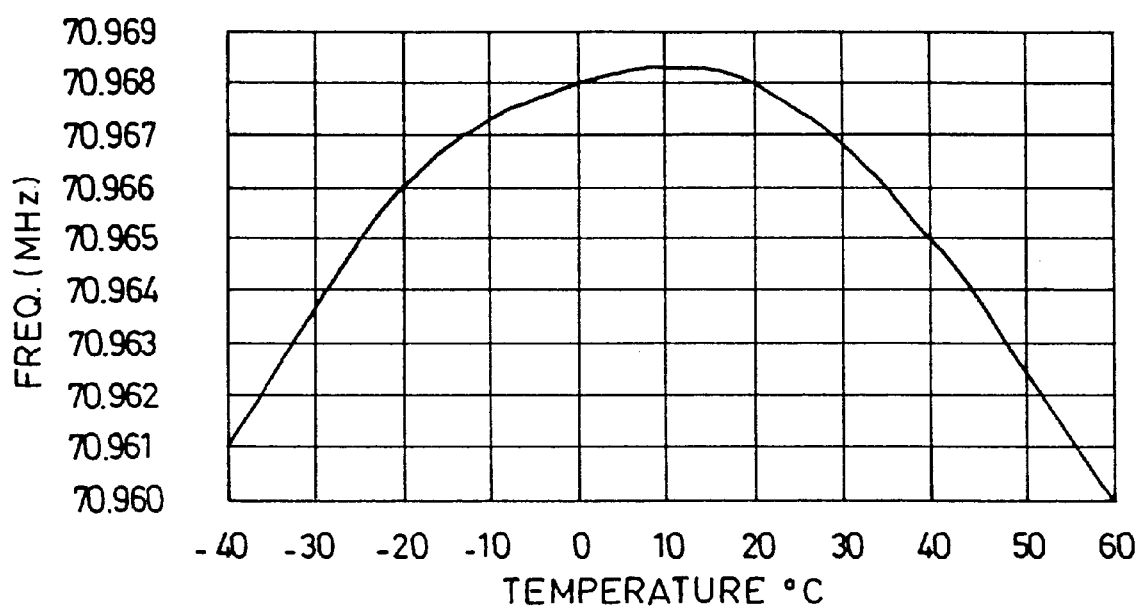
FIG. 11 illustrates the progress of the frequency as a function of the temperature for the filter made on the section defined by the angles φ=−20°, θ=−35.5° and ψ=+20°.

An illustration of the practical implementation of one of the novel quartz cuts is presented hereinafter. It consists of the manufacture of a resonant DART type filter according to the GSM standard centered on the 71 MHz frequency. The filter therefore has two transducers, both weighted by elimination, of sources as well as two reflective gratings located in the inter-transducer cavity, themselves separated by a distance of a quarter-wavelength. This structure of electrodes is made on the cut (f), whose definition may be recalled (cut (YXwlt) −20,−35.5,+20) by the deposition of chemically etched aluminum. The dimensions of the resulting crystal chip enable its encapsulation in a 10×6 mm² package. The value of the use of the novel cut then lies in a substantial reduction of the thickness of metal needed to make the reflective part of the resonant DART. Indeed, the thickness is reduced from 14000 Å (section ST) to 8000 Å for the new cut, thus making the manufacture of the device less subject to purely technological manufacturing defects. FIG. 8 shows the spatial distribution of the reflectors R (expressed by wavelength) and the distribution of the standardized transducers T, the coefficient of an elementary reflector being 2.92%. This corresponds to a maximum of 5.84% per wavelength. The filter which is designed to work with an input impedance $Z_{in}$=3000Ω and an output impedance $Z_{out}$=500Ω (see FIG. 9), is tuned by means of a 1.1 μH parallel self-inductance at input and a pair formed by a parallel inductance and a series capacitor at output, this inductance and capacitor having respective values of 600 nH and 2 pF. The curve shown in FIG. 10 enables an assessment of the quality of the electrical response of the filter on a cut (f) with a rejection far greater than 40 dB and band losses of about -7.5 dB. It must be noted however that it was necessary, during the designing and the manufacture of the filter, to get rid of the reflection coefficient phase (inherent in most new cuts) by shifting the reflectors with respect to the transducers in the elementary DART cell, said phase being theoretically estimated at 162.4°. This means that the wave reflected on the reflector is phase-shifted by ±162.4°−90° instead of the −90° that would have been obtained on ST quartz. The two directions of propagation are then no longer equivalent, and the centers of transduction and reflection need to be shifted in the DART cells so that they can be take into account. Finally, FIG. 11 shows that the Rayleigh waves, given the relative thickness of metallization used (h/λ in the range of 1.67%), are temperature-compensated in the neighborhood of the ambient temperature, thus making it possible to obtain a parabolic frequency/temperature relationship for the filter whose point of reversal is between 10 and 20° C. It may be noted that the second-order coefficient of sensitivity to temperature is substantially greater than that of the ST-cut (−50 ppb/° K² for the cut (f) against −40 ppb/° K² for the ST-cut) but nevertheless remains in the same order of magnitude.

What is claimed is:

1. A surface acoustic wave device comprising:
   a quartz substrate having a surface of propagation of surface acoustic waves;
   transduction center means and reflection center means formed on said substrate;
   the substrate having a cutting plane (X", Z") defined with respect to the cutting plane (X, Z) and in a reference system (X", Y", Z"), where X, Y, Z are crystallographic axes of quartz, a direction of propagation of the waves being defined along an axis X'", a first cutting plane (X', Z') being defined by rotation by an angle φ about the axis Z of the plane (X, Z) so as to define a first reference system (X', Y', Z') with an axis Z' that is the same as the axis Z, a second cutting plane (X", Z") being defined by rotation by an angle θ about the axis X' of the plane (X', Z') so as to define a second reference system (X", Y", Z") with the axis X" being the same as the axis X', the direction of propagation along the axis X'" being defined by rotation by an angle ψ of the axis X", in the plane (X", Z") about the axis Y", wherein:
   $60° \leq \phi \leq 0°$,
   θ is contained in a range of −40° (cos(3φ))±400°,
   ψ is contained in a range of 35°+10° (sine(3φ))±22.5°.

2. A surface acoustic wave device according to claim 1, wherein
   (θ, ψ) are defined so that a first-order coefficient of a variation in frequency as a function of temperature ranges from −10 ppm/° K to +10 ppm/° K and an angle of flux ranges from −5° to +5°.

3. A device according to claim 1, wherein said means for forming transducer means and reflection center means comprises interdigitated electrodes.

4. A device according to claim 1, wherein said reflection center means comprises arrays of electrodes.

5. A device according to claim 3, wherein said transduction center means comprises etched grooves on said quartz substrate.

6. A device according to claim 3, wherein said interdigitated electrodes are made of aluminum.

7. A surface acoustic wave device comprising:

a quartz substrate having a surface of propagation of surface acoustic waves;

electrodes forming transduction centers and reflection centers on said substrate;

the substrate having a cutting plane (X", Z") defined with respect to the cutting plane (X, Z) and in a reference system (X", Y", Z"), where X, Y, Z are crystallographic axes of quartz, a direction of propagation of the waves being defined along an axis X''', a first cutting plane (X', Z') being defined by rotation by an angle φ about the axis Z of the plane (X, Z) so as to define a first reference system (X', Y', Z') with an axis Z' that is the same as the axis Z, a second cutting plane (X", Z") being defined by rotation by an angle θ about the axis X' of the plane (X', Z') so as to define a second reference system (X", Y", Z") with the axis X" being the same as the axis X', the direction of propagation along the axis X''' being defined by rotation by an angle ψ of the axis X", in the plane (X", Z") about the axis Y", wherein:

60°≦φ≦0°,

θ is contained in a range of −40° (cos(3φ))±40°,

ψ is contained in a range of 35°+10° (sine(3φ))±22.5°.

8. A surface acoustic wave device according to claim 7, wherein (θ, ψ) are defined so that a first-order coefficient of a variation in frequency as a function of temperature ranges from −10 ppm/° K to +10 ppm/° K and an angle of flux ranges from −5° to +5°.

9. A device according to claim 7, wherein said electrodes forming said transducer centers and reflection centers are interdigitated.

10. A device according to claim 7, wherein said electrodes forming said reflection centers include arrays of electrodes.

11. A device according to claim 9, wherein said electrodes forming said transduction centers include etched grooves on said substrates.

12. A device according to claim 9, wherein said electrodes are made of aluminum.

* * * * *